US008989404B2

(12) United States Patent
De Poortere

(10) Patent No.: US 8,989,404 B2
(45) Date of Patent: Mar. 24, 2015

(54) DRIVING OF MULTI-CHANNEL SPEAKERS

(75) Inventor: Gerrit De Poortere, Borgerhout (BE)

(73) Assignee: Woox Innovations Belgium NV (BE)

( * ) Notice: Subject to any disclaimer, the term of this patent is extended or adjusted under 35 U.S.C. 154(b) by 506 days.

(21) Appl. No.: 13/265,461

(22) PCT Filed: Apr. 8, 2010

(86) PCT No.: PCT/IB2010/051516
§ 371 (c)(1),
(2), (4) Date: Oct. 20, 2011

(87) PCT Pub. No.: WO2010/122441
PCT Pub. Date: Oct. 28, 2010

(65) Prior Publication Data
US 2012/0033818 A1 Feb. 9, 2012

(30) Foreign Application Priority Data
Apr. 21, 2009 (EP) .................................... 09158321

(51) Int. Cl.
*H03G 5/00* (2006.01)
*H04R 3/00* (2006.01)
*H04R 3/14* (2006.01)
*H03G 3/00* (2006.01)
(Continued)

(52) U.S. Cl.
CPC *H04R 3/007* (2013.01); *H04R 3/04* (2013.01); *H04R 3/14* (2013.01); *H04R 29/001* (2013.01)
USPC ............................................ 381/99; 381/104

(58) Field of Classification Search
CPC ....... H04R 3/04; H04R 3/007; H04R 2430/03
USPC ............ 381/17, 103, 104, 98, 99, 55; 700/94; 330/251, 262, 254; 327/58
See application file for complete search history.

(56) References Cited

U.S. PATENT DOCUMENTS 4,583,245 A * 4/1986 Gelow et al. .................... 381/59
4,888,811 A 12/1989 Takashi
6,665,408 B1 12/2003 Schott
(Continued)

FOREIGN PATENT DOCUMENTS

FR 2890280 3/2007
JP 08033093 2/1996
(Continued)

*Primary Examiner* — Xu Mei
*Assistant Examiner* — Ammar Hamid
(74) *Attorney, Agent, or Firm* — Ryan Kromholz & Manion, S.C.

(57) ABSTRACT

A drive system comprises a splitter (107) which generates a low frequency signal and high frequency signal from an input signal. A first drive circuit (111, 115) is coupled to the splitter (107) and generates a drive signal for an audio driver (105) from the low frequency signal. A second drive circuit (117, 119) is coupled to the splitter (117) and generates a drive signal for a second audio driver (101) from the high frequency signal. The second drive circuit (117, 119) provides a bass frequency extension for the second audio driver (101) by applying low frequency boost to the low frequency signal. A processor (125) determines a driver excursion indication for the second audio driver (101) and a controller (127) performs a combined adjustment of a cross-over frequency for the high and low frequency signals and a characteristic of the low frequency boost based on the driver excursion indication. The invention may provide improved interworking between e.g. a subwoofer and satellite speakers.

14 Claims, 4 Drawing Sheets

(51) Int. Cl.
*H04R 3/04* (2006.01)
*H04R 29/00* (2006.01)

(56) References Cited

U.S. PATENT DOCUMENTS

| | | | |
|---|---|---|---|
| 7,466,829 | B1 | 12/2008 | Anderson |
| 2006/0062404 | A1 | 3/2006 | Bharitkar et al. |
| 2007/0003075 | A1 | 1/2007 | Cooper et al. |
| 2008/0137872 | A1 * | 6/2008 | Croft ............................ 381/55 |

FOREIGN PATENT DOCUMENTS

| | | | |
|---|---|---|---|
| WO | 0030403 | A2 | 5/2000 |
| WO | 03028230 | A1 | 4/2003 |

* cited by examiner

DRIVING OF MULTI-CHANNEL SPEAKERS

CROSS-REFERENCE TO PRIOR APPLICATIONS

This application is the U.S. National Stage application under 35 U.S.C. §371 of International Application No. PCT/IB2010/051516, filed on Apr. 8, 2010, which claims the benefit of European Patent Application No. 09158321.1, filed on Apr. 21, 2009. These applications are hereby incorporated by reference herein.

FIELD OF THE INVENTION

The invention relates to driving of multi-channel speakers and in particular, but not exclusively, to driving of speakers in a home cinema sound system.

BACKGROUND OF THE INVENTION

Sound reproduction using more than two channels for providing an enhanced spatial experience has become very popular. For example, home cinema sound systems employing five or seven different spatial channels have become very popular. However, in order to reduce the impact of having to provide such a high number of sound sources, most home cinema sound systems use relatively small satellite loudspeakers for mid and high frequency reproduction combined with a subwoofer for low frequency reproduction. Such an arrangement exploits the fact that human perception predominantly takes the spatial direction cues from mid to high frequencies whereas the spatial cues from low frequency audio are often relatively insignificant.

The frequency that indicates the differentiation between the subwoofer's frequency range and the satellite speakers' frequency range is typically referred to as the cross-over frequency. The size and quality of the satellite drivers is a compromise between sound quality, design and cost. In particular, the desire to reduce the size of the satellite loudspeakers results in the cross-over frequency often being selected to be relatively high and may in practice often be in the range of e.g. 100-250 Hz (most typically around 150-200 Hz.

However, at these frequencies the radiated sound will be perceived to have some directional cues and the high cross-over frequency may thus reduce the perceived quality and may in particular result in degraded spatial perception. Indeed, typically the sound stage tends to become blurry, and attenuated voices may be perceived to originate partially from the subwoofer rather than the desired spatial position.

Hence, an improved system would be advantageous and in particular a system allowing increased flexibility, improved spatial perception, improved quality, reduced size speakers, facilitated implementation and/or improved performance would be advantageous.

SUMMARY OF THE INVENTION

Accordingly, the Invention seeks to preferably mitigate, alleviate or eliminate one or more of the above mentioned disadvantages singly or in any combination.

According to an aspect of the invention there is provided drive system for generating drive signals for audio drivers, the drive system comprising: a splitter for generating a first signal and a second signal from an input signal, wherein the first signal comprises signal components of a first frequency interval of the input signal and the second signal comprises signal components of a second frequency interval of the input signal, the first and second frequency intervals having a cross-over frequency and the first frequency interval corresponding to lower frequencies than the second frequency interval; a first drive circuit coupled to the splitter and arranged to generate a first drive signal for a first audio driver from the first signal; a second drive circuit coupled to the splitter and arranged to generate a second drive signal for a second audio driver from the second signal; means for determining a driver excursion indication for the second audio driver; means for providing a bass frequency extension for the second audio driver by applying low frequency boost to the second signal; and adjustment means for performing a combined adjustment of the cross-over frequency and a characteristic of the low frequency boost in response to the driver excursion indication.

The invention may provide improved performance in many embodiments. In particular, the invention may provide improved performance for systems using one or more smaller speakers. In particular, the second audio driver may be of relatively small size. The invention may allow the second audio driver to be operated more efficiently and may in particular allow the second driver to be used for lower frequencies in some scenarios. The inventor has in particular realised that the dynamic adaptation of both a low frequency extension and the cross-over may allow an improved performance and provide a better tradeoff. In particular, the bass frequency extension and the separation between the frequency intervals for the first and second audio drivers need not be dimensioned for worst case scenarios. In particular, the invention may allow the use of the second driver at lower frequencies in many low volume scenarios without increasing the risk of distortion or damaging the second audio driver during high volume scenarios. For typical usage, the invention may e.g. provide an improved spatial perception and a more well defined sound stage.

The second audio driver and/or the first audio driver may be loudspeakers. In particular, the first audio driver may be a subwoofer and the second audio driver a satellite speaker of a surround sound system, such as e.g. a home cinema sound system.

The driver excursion indication may be a direct or indirect measure of the driver excursion. For example, a sound level or volume indication may be used as a drive excursion indication.

The cross-over frequency and/or the low frequency boost may specifically be controlled by adjusting a frequency response for the second drive signal. The frequency response may represent the effective transfer function experienced for the signal path from the input signal to the second drive signal. The cross-over frequency and/or low frequency boost may for example be modified by adjusting a frequency response of e.g. the splitter and/or of the second drive circuit.

In accordance with an optional feature of the invention, the low frequency boost provides increased gain for frequencies of the second signal within a first frequency band of the second frequency interval relative to frequencies of the second frequency band above the first frequency band.

This may provide an efficient bass frequency extension for the second audio driver and may specifically allow the usable frequency range for the second audio driver to be extended towards lower frequencies.

In accordance with an optional feature of the invention, the increased gain is at least 3 dB higher than an average gain for frequencies of the second signal within the second frequency interval and above the first frequency band.

This may provide an efficient bass frequency extension for the second audio driver and may in particular allow the second audio driver to be used down to frequencies where a substantial reduction in the sensitivity or efficiency of the second audio driver occurs.

In accordance with an optional feature of the invention, the adjustment means is arranged to adjust the cross-over frequency within a frequency range and to provide increased gain for at least some frequencies above a current value of the cross-over frequency but within the frequency range.

This may provide particularly advantageous performance in many scenarios. Specifically, the bass frequency extension may for some driver excursion indications be active at frequencies that at other times would be attenuated to provide a higher cross-over frequency.

In accordance with an optional feature of the invention, the adjustment means is arranged to modify a frequency characteristic of the low frequency boost in response to the driver excursion indication.

This may provide particularly advantageous performance in many embodiments. For example, the frequencies at which the low frequency bass boost is applied may be dynamically varied. In some embodiments, the lower frequency for a frequency band in which the low frequency boost is applied may be adjusted in dependence on the driver excursion indication.

In accordance with an optional feature of the invention, the adjustment means is arranged to bias the cross-over frequency and a lower frequency for the low frequency boost towards lower frequencies for a reduced driver excursion.

This may provide particularly advantageous performance. Specifically, the invention may allow the bass frequency extension to be extended to lower frequencies for lower sound levels, thereby allowing the second audio driver to reproduce a larger part of the sound image, resulting in e.g. an improved spatial perception and a more defined sound stage. However, at higher sound levels, the bass frequency extension may be reduced thereby reducing the risk of distortion or damage caused by excessive driver excursions.

In accordance with an optional feature of the invention, the adjustment means is arranged to modify a gain characteristic of the low frequency bass boost in response to the driver excursion indication.

This may provide particularly advantageous performance in many embodiments. For example, the gain applied at a given frequency may be adjusted to provide a suitable compensation for a reduction in the efficiency of the second audio driver while ensuring that this will not result in an excessive excursion.

In accordance with an optional feature of the invention, the adjustment means is arranged to vary a frequency response for the second drive signal such that a gain in at least a first frequency band is higher than an average gain of the frequency response above the first frequency band and within the second frequency interval for at least one value of the cross-over frequency, and below the average gain for at least a second value of the cross-over frequency.

This may provide particularly advantageous performance in many embodiments. For example, for the first frequency band the gain may be adjusted to be above the average gain or below the average gain dependent on whether the frequency band is above or below the cross-over frequency. Thus, for some frequencies the frequency response for the second drive signal may either provide an amplification or an attenuation depending on the current driver excursion indication.

In some embodiments, the adjustment means is arranged to set the cross-over frequency to a first frequency for the driver excursion indication having a first value and to a second frequency for the driver excursion indication having a second value, the first frequency being lower than the second frequency and the first value being indicative of a lower driver excursion than the second value. In such embodiments, the adjustment means may be further arranged to set a gain for the second signal for a frequency between the first frequency and the second frequency higher than a gain for the second drive signal at the second frequency for the first value and lower than the gain for the second drive signal at the second frequency for the second value.

In accordance with an optional feature of the invention, the boost means is arranged to provide the low frequency boost to compensate a sensitivity reduction for the second audio driver.

This may allow the second audio driver to be used at lower frequencies and may in particular allow the second audio driver to be used at frequencies for which the frequency response of the second audio driver provides a substantial attenuation. Thus, frequency response distortions caused by the characteristics (and specifically the frequency response) of the second audio driver may be compensated thereby allowing the second audio driver to be used over a larger frequency range. This may result in improved spatial perception and audio quality for a user. In particular, it may allow satellite speakers of a home cinema sound system to provide a larger part of the sound generation thereby improving the perceived audio quality.

In accordance with an optional feature of the invention, the drive system further comprises means for determining the driver excursion indication in response to a volume setting for the drive system.

This may provide particularly advantageous performance in many embodiments and may specifically allow a low complexity and low cost implementation.

In accordance with an optional feature of the invention, the drive system further comprises means for measuring a signal level for the second signal at a point of the signal path for the second signal provided by the second drive circuit; and means for determining the driver excursion indication in response to the signal level.

This may provide particularly advantageous performance in many embodiments and may specifically allow a dynamic, flexible and/or accurate adaptation of the operation of the system.

In accordance with an optional feature of the invention, the drive system further comprises: means for receiving a measurement signal from a driver excursion measuring device proximal to the second audio driver; and means for determining the driver excursion indication in response to the measurement signal.

This may provide particularly advantageous performance in many embodiments and may specifically allow a dynamic, flexible and/or accurate adaptation of the operation of the system. The approach may allow a more direct and thus accurate determination of the driver excursion and accordingly may provide an improved adaptation of the operation.

The measuring means may specifically include an accelerometer or a microphone which specifically may be mounted on or near the second audio driver.

In accordance with an optional feature of the invention, the drive system further comprises: a further splitter for generating a third signal and a fourth signal from a further input signal, wherein the third signal comprises signal components of the first frequency interval of the further input signal and the fourth signal comprises signal components of the second frequency interval of the further input signal; a third drive circuit coupled to the further splitter and arranged to generate a third drive signal for a third audio driver from the fourth signal; and wherein the first drive circuit is arranged to generate the first drive signal from a combination of the first signal and the third signal.

This may provide particularly advantageous performance in many embodiments such as for multi-channel surround systems.

According to an aspect of the invention there is provided a surround sound speaker system comprising: a driver system as described above; the first audio driver being a subwoofer; and a plurality of speakers including the second audio driver.

According to an aspect of the invention there is provided a method of operation for a drive system, the method comprising: generating a first signal and a second signal from an input signal, wherein the first signal comprises signal components of a first frequency interval of the input signal and the second signal comprises signal components of a second frequency interval of the input signal, the first and second frequency intervals having a cross-over frequency and the first frequency interval corresponding to lower frequencies than the second frequency interval; generating a first drive signal for a first audio driver from the first signal; generating a second drive signal for a second audio driver from the second signal; determining a driver excursion indication for the second audio driver; providing a bass frequency extension for the second audio driver by applying low frequency boost to the second signal; and performing a combined adjustment of the cross-over frequency and a characteristic of the low frequency boost in response to the driver excursion indication.

These and other aspects, features and advantages of the invention will be apparent from and elucidated with reference to the embodiment(s) described hereinafter.

BRIEF DESCRIPTION OF THE DRAWINGS

Embodiments of the invention will be described, by way of example only, with reference to the drawings, in which.

DETAILED DESCRIPTION OF SOME EMBODIMENTS OF THE INVENTION

The following description focuses on embodiments of the invention applicable to a multi-channel surround sound audio system. However, it will be appreciated that the invention is not limited to this application but may be applied to many other sound systems.

Figure 1:
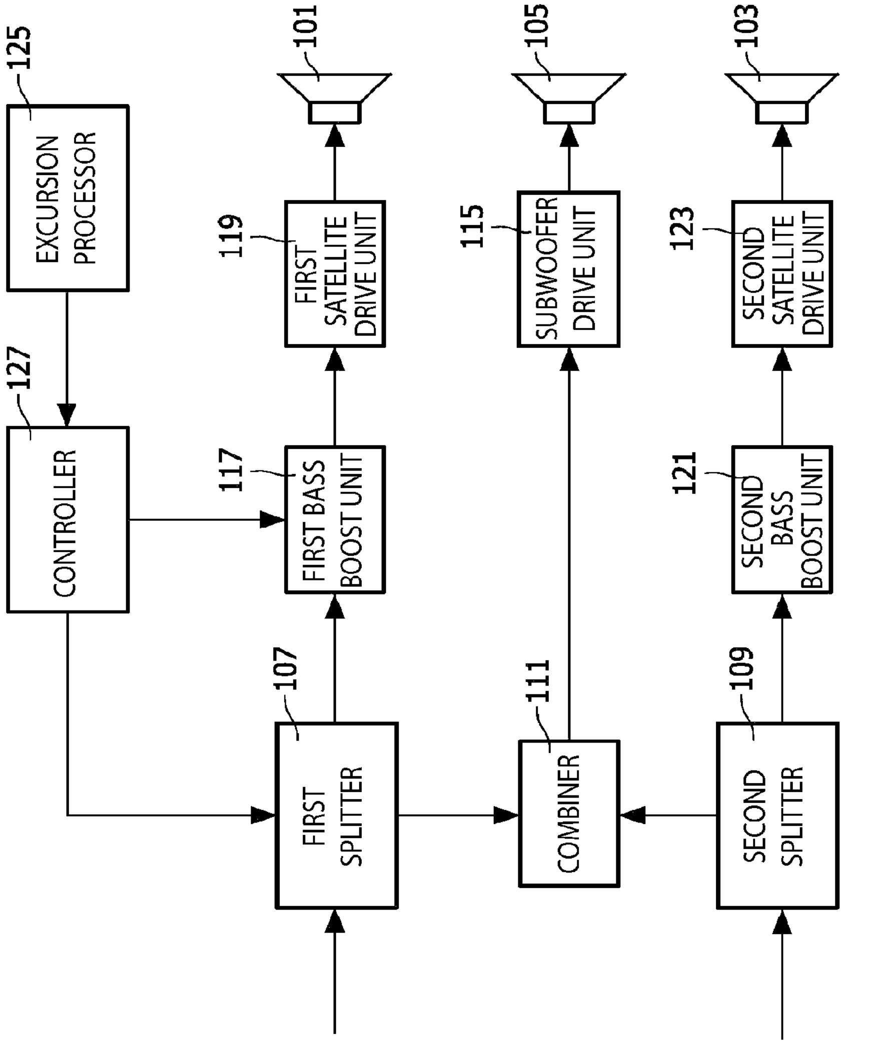
FIG. 1 illustrates an example of an audio system in accordance with some embodiments of the invention.

FIG. 1 illustrates an example of an audio system in accordance with some embodiments of the invention. The audio system comprises a drive system for driving a plurality of audio drivers (such as loudspeakers). The drive system may specifically be a multi-channel audio amplifier.

In the example, the audio system is a home cinema system providing surround sound through the use of a discrete satellite loudspeaker for each spatial channel and a subwoofer which is common for the plurality of the spatial channels.

Thus, FIG. 1 illustrates a plurality of audio drivers 101, 103 which each radiate sound for one spatial channel. The audio drivers 101, 103 are specifically satellite loudspeakers which are relatively small and accordingly have a relatively limited frequency range. Specifically, the efficiency or sensitivity of the satellite speakers 101, 103 drops for lower frequencies. Typically, practical satellite speakers may have a 3 dB cut-off frequency of between 100 Hz-300 Hz. The efficiency may be determined as the sound pressure level generated for a given constant signal level of the drive signal and the efficiency may be determined as the signal level required for the drive signal to provide a given sound pressure level (e.g. at a given distance).

In addition, FIG. 1 illustrates a second audio driver 105 for low frequency sound reproduction. The second audio driver 105 is a subwoofer which is optimised for reproduction of lower frequencies and specifically the subwoofer 105 provides an efficient production of bass frequencies of up to typically 100 Hz-200 Hz. In the system, the subwoofer 105 is used to produce sound from all the spatial channels and thus only a single speaker is used for producing the bass frequencies.

For brevity, FIG. 1 illustrates only two spatial channels and accordingly illustrates only two satellite speakers 101, 103. However, it will be appreciated that typically a larger number of spatial channels and thus satellite speakers may be employed. Indeed, many home cinema surround systems support five or seven spatial channels. It will also be appreciated that in addition to the spatial channels, a dedicated Low Frequency Effect (LFE) channel may be provided. Such an LFE channel may be reproduced by the subwoofer 105. Thus, the subwoofer may produce sound corresponding to both an LFE channel as well as to the lower frequencies of the spatial channels.

In the system, the spatial channel signals are split such that lower frequencies are fed to the subwoofer 105 and higher frequencies are fed to the respective satellite speaker 101, 103. In addition, signals for the satellite speakers 101, 103 are processed by an equalizer which provides a frequency extension for the satellite speakers 101, 103 by providing a low frequency boost/amplification for the signals. Thus, towards lower frequencies the gain is increased for the satellite speaker signals in order to compensate for the reduced sensitivity/efficiency of the small satellite speakers 101, 103 at these frequencies. Thus, the equalizer will extend the frequency range of the satellite speakers 101, 103 towards the low frequencies.

Furthermore, in the system, both the cross-over frequency and the amount of bass frequency extension is dynamically controlled in response to an indication of the excursion experienced by the satellite speakers 101, 103.

Specifically, at lower sound levels, a very substantial bass frequency extension may be applied in order to operate the satellite speakers 101, 103 at lower frequencies despite the reduced efficiency of the speakers at these frequencies. In addition, the cross-over frequency is reduced thereby resulting in a larger proportion of the spatial signals being produced by the satellite speakers 101, 103 rather than by the subwoofer 105. In addition, this reduces the amount and noticeability of signal components from the spatial channels which are reproduced by the subwoofer 105 despite being at frequencies that are high enough to provide some spatial cues (e.g. from 100 Hz-300 Hz). Thus, an improved audio quality and especially spatial perception is provided to the user. Specifically, a better defined sound stage is achieved.

However, such bass frequency extension results in an increased excursion of the diaphragm of the satellite speaker 101, 103 for a given desired sound level. However, at higher sound levels such additional excursion cannot be supported by the satellite speakers 101, 103 and accordingly distortion or even damage to the satellite speakers may occur. In the system of FIG. 1, both the cross-over frequency and the bass frequency extension is modified dependent on the excursion indication and specifically the cross-over frequency is increased and the amount of bass frequency extension is reduced thereby limiting the relative additional excursion and ensuring that distortion and damage does not occur.

Thus, the system dynamically adapts the performance to the current conditions thereby providing optimised audio quality for the specific conditions experienced while ensuring that the satellite speaker is operated within a safe operating range.

In more detail, a first signal, being a signal of a first spatial channel, is fed to a first splitter 107. The first splitter 107 is arranged to split the first signal into a first subwoofer signal and a first satellite signal. In the specific example, the first splitter 107 generates the first subwoofer signal to include the frequency components of the first signal within a first frequency interval (or range) and generates the first satellite signal to include signal components of the first signal in a second frequency intervals. The frequency intervals are such that that the first satellite signal corresponds to a higher frequency band than the first subwoofer signal. Thus, the first frequency interval corresponds to lower frequencies than the second frequency interval.

It will be appreciated that any suitable criterion or definition of the frequency intervals may be used. For example, the upper and lower frequency limits of an interval may be defined as the frequencies at which a gain for the input signal has reduced by a predetermined value (e.g. 3 dB or 6 dB) relative to a maximum or average gain for the signal (possibly within the first or second frequency interval respectively).

The first splitter 107 may specifically be implemented by two filters. For example, a low pass filter may be applied to the first signal to generate the first subwoofer signal and a high pass filter may be applied to the first signal to generate the first satellite signal. As another example, the splitter 107 may apply two bandpass filters to the first signal where the filter generating the first satellite signal covers a higher frequency range than the filter generating the first subwoofer signal.

Figure 2:
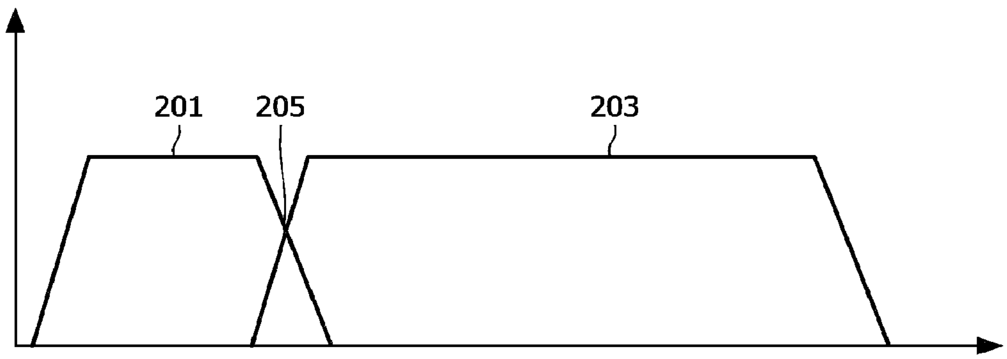
FIG. 2 illustrates an example of frequency responses for elements of an audio system in accordance with some embodiments of the invention.

FIG. 2 illustrates an example of the filtering that may be applied by the filter. In the example, the first frequency response 201 is used to generate the first subwoofer signal and the second frequency response 203 is used to generate the first satellite signal.

The first and second frequency intervals furthermore have a cross-over frequency. The cross-over frequency is in the specific example, the frequency at which the two frequency intervals have the same gain. In some embodiments, the cross-over frequency may be defined as the frequency for which the gain of the signal path from the splitting of the input signal to the output of the drive system is the same.

In some embodiments, the cross-over frequency may be defined as the frequency in which the sound pressure level curves for the satellite speaker 101, 103 and the subwoofer intersect. Thus, the cross-over frequency may be the frequency at which the sound pressure levels generated by the satellite speaker 103 and the subwoofer 105 are identical. In some embodiments, the cross-over frequency may be represented by a cross-over frequency range. For example, the cross-over frequency range may be considered the range in which the sound pressure levels of the satellite speaker 101 and the subwoofer 103 are within a given threshold of each other, e.g. within 1 dB of each other. Thus, the cross-over frequency range may be the range in which the sound pressure level curves substantially intersects each other. Such a situation may for example occur in a scenario where the subwoofer's 105 cut-off frequency remains constant and only the satellite's 101, 103 cut-off frequency varies. For example, in such a scenario, the subwoofer 105 output may be constant and corresponding to the satellite output in a frequency range. For a cross over frequency range, a single cross-over frequency may further be considered as any specific frequency within the cross-over frequency interval, such as e.g. the lowest frequency of the cross-over frequency range.

In the example of FIG. 2, the cross-over frequency 205 is the frequency for which the signal is equally represented in the first satellite signal and the first subwoofer signal.

Similarly, a second signal, being a signal of a second spatial channel, is fed to a second splitter 109 which is arranged to split the second signal into a second subwoofer signal and a second satellite signal. In the specific example, the second splitter 109 is identical to the first splitter 107 and uses the same filtering. However, it will be appreciated that in some embodiments the splitters may be different for different spatial channels.

The first and second splitters 107, 109 are coupled to a combiner 111 which combines the first subwoofer signal and second subwoofer signal into a single combined subwoofer signal. The combiner 111 may specifically be implemented as a simple adder although more complex combinations may be used in other embodiments.

The combiner 111 is coupled to a subwoofer drive unit 115 which is further coupled to the subwoofer 105. The subwoofer drive unit 115 amplifies the combined subwoofer signal to generate a subwoofer output signal which is fed to the subwoofer 105.

In the specific example, the frequency responses for the signal paths of the subwoofer signal from respectively the first and second input signals is predominantly determined by the filtering of the first and second splitter 107, 109 respectively. Thus, the frequency responses of the combiner 111 and the subwoofer drive units 115 can be considered flat (constant gain) within the subwoofer frequency interval.

Thus, the subwoofer 105 receives a signal which includes lower (bass) frequencies from the spatial channels. The signals from different spatial channels are combined. For very low frequencies where the human perception is insensitive to spatial cues, such combined and non localised sound production is not perceived as reducing quality. However, for slightly higher frequencies where spatial perception starts to become active (typically for frequencies around 100 Hz to 300 Hz), this may lead to a reduced spatial perception and specifically to a more diffuse and blurred sound stage. Accordingly, it is desirable for the frequency range predominantly supported by the subwoofer to be kept to as low frequencies as is possible.

In order to extend the use of the first satellite speaker 101 to lower frequencies, the first splitter 107 is coupled to a first bass boost unit 117 which is arranged to provide a bass frequency extension for the second audio driver by applying a low frequency boost to the second signal. Thus for the lower frequencies of the satellite speaker frequency interval 203, the first bass boost unit 117 may increase the gain in order to compensate for the reduced sensitivity and efficiency at these frequencies.

Figure 3:
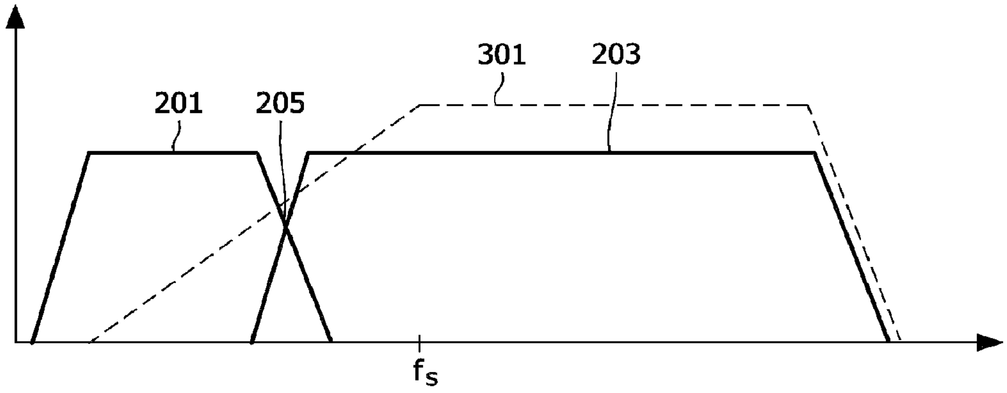
FIG. 3 illustrates an example of frequency responses for elements of an audio system in accordance with some embodiments of the invention.

As a specific example, FIG. 3 illustrates a frequency sensitivity response 301 for a satellite speaker 103 together with the frequency responses from the first splitter 107. The frequency response indicates the sensitivity or efficiency of the satellite speaker measured as relationship between the produced sound level and the corresponding power of the drive signal supplied to the satellite speaker. As illustrated, the small size of the satellite speaker results in the sound pressure level for a given drive signal reducing at lower frequencies of the frequency interval covered by the satellite speaker. In the example, the sensitivity begins to reduce from frequency $f_s$ which in many practical systems may be in the interval from 150 Hz-300 Hz.

Figure 4:
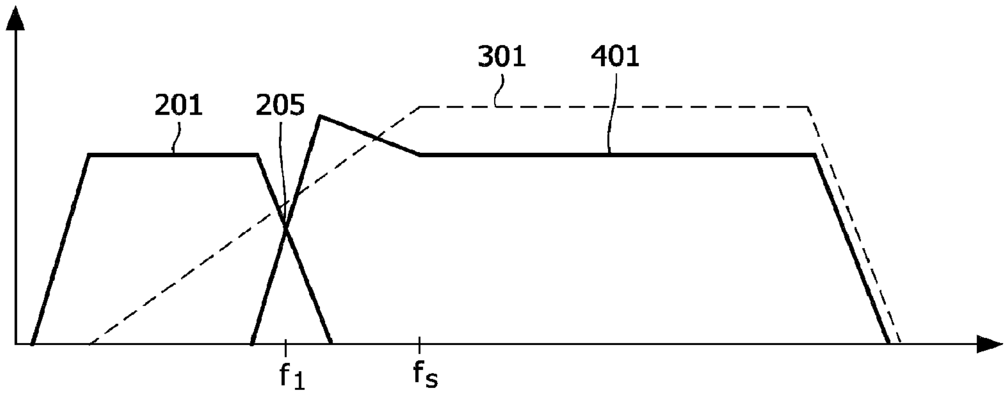
FIG. 4 illustrates an example of frequency responses for elements of an audio system in accordance with some embodiments of the invention.

In the system, the usable frequency range for the satellite speakers 101 is extended towards lower frequencies by the first bass boost unit 117 providing an increased gain at lower frequencies relative to higher frequencies. This low frequency boost may e.g. result in a combined frequency response 401 of the first splitter 107 and the first bass boost unit 117 as illustrated in FIG. 4. Thus, the effective frequency range is provided with a boost or gain increase towards lower frequencies thereby compensating the reduced sensitivity of the speaker.

The first bass boost unit 117 is furthermore coupled to a first satellite drive unit 119 which is coupled to the first satellite speaker 101. The first satellite drive unit 119 receives the bass frequency extended satellite signal and generates the corresponding output drive signal for the satellite speaker 101. The first satellite drive unit 119 may specifically comprise a suitable audio power amplifier.

The second splitter 109 is similarly coupled to a second bass boost unit 121 which is furthermore coupled to a second satellite drive unit 123 that generates the output drive signal for the second satellite speaker 103. The second bass boost unit 123 and second satellite drive unit 123 are specifically identical to the first bass boost unit 117 and the first satellite drive unit 119 and provides the same processing for the satellite signal generated by the second splitter 109.

Thus, in the system, each spatial channel is split into a satellite signal for sound production from a satellite speaker 101, 103 and a subwoofer signal for sound prediction from a subwoofer 105. The subwoofer signals are combined into a single combined subwoofer signal whereas the satellite signals are each processed through an individual drive circuit which not only includes power amplifiers, variable gains etc but also includes functionality for providing bass frequency extension for the satellite speakers 101, 103.

This bass frequency extension allows satellite speakers of a given size to be used at lower frequencies thereby allowing the system to rely less on the subwoofer. However, a problem with such bass extension is that the increased signal levels at lower frequencies result in and require higher excursions of the diaphragm in order to produce the required sound pressure levels. This higher relative excursion may be acceptable at lower nominal excursions (corresponding to lower sound levels) but may at higher nominal excursions (corresponding to higher sound levels) result in distortion or even damage as the additional required excursion cannot be achieved within the physical constraints of the satellite speaker.

In the system of FIG. 1, a dynamic and variable adjustment of both the cross-over frequency and the characteristics of the bass frequency extension are applied in order to ensure that the performance is optimised for the specific conditions. Specifically, the cross-over frequency and bass frequency extension are controlled such that the proportion of the frequency spectrum that is supported by the satellite speakers 101, 103 is increased while ensuring that the diaphragm excursion for the satellite speakers 101, 103 are kept in a safe operation range.

For this purpose, the system of FIG. 1 comprises an excursion processor 125 which is arranged to generate a driver excursion indication for the first satellite speaker 101. The driver excursion indication may be a direct or indirect indication and may be based on a measured parameter or may e.g. be calculated/estimated from settings of the drive system. The driver excursion indication may specifically be a sound level indication as higher sound levels will result in higher excursions.

The excursion processor 125 is coupled to a controller 127 which receives the driver excursion indication and which performs a combined adjustment of the cross-over frequency and a characteristic of the low frequency boost in response to the driver excursion indication. Thus, the controller 127 is coupled to the first splitter 107 and the first bass boost unit 117.

For brevity and clarity, the dynamic adjustment will be described with reference to only the first spatial channel/satellite speaker 101. However, it will be appreciated that in many embodiments similar functionality may be applied to a plurality of the spatial channels and typically to all spatial channels. For example, the controller 127 may control the second splitter 109 and the second bass boost unit 121 in exactly the same way it controls the first satellite speaker 101 and the first bass boost unit 117.

The controller 127 is specifically arranged to bias the cross-over frequency and a lower frequency for the low frequency bass boost towards lower frequencies for a reduced driver excursion. Specifically, at low driver excursions, the controller 127 may control the first bass boost unit 117 to extend the frequency range in which the bass boost is provided towards lower frequencies. At the same time, the controller 127 controls the first splitter 107 to reduce the cross-over frequencies towards lower frequencies. However, when the driver excursion indication is indicative of a higher driver excursion, the controller 127 may control the first bass boost unit 117 to increase the lower frequency of the frequency range in which the additional gain is provided while at the same time controlling the first splitter 107 to increase the cross-over frequencies.

Figure 5:
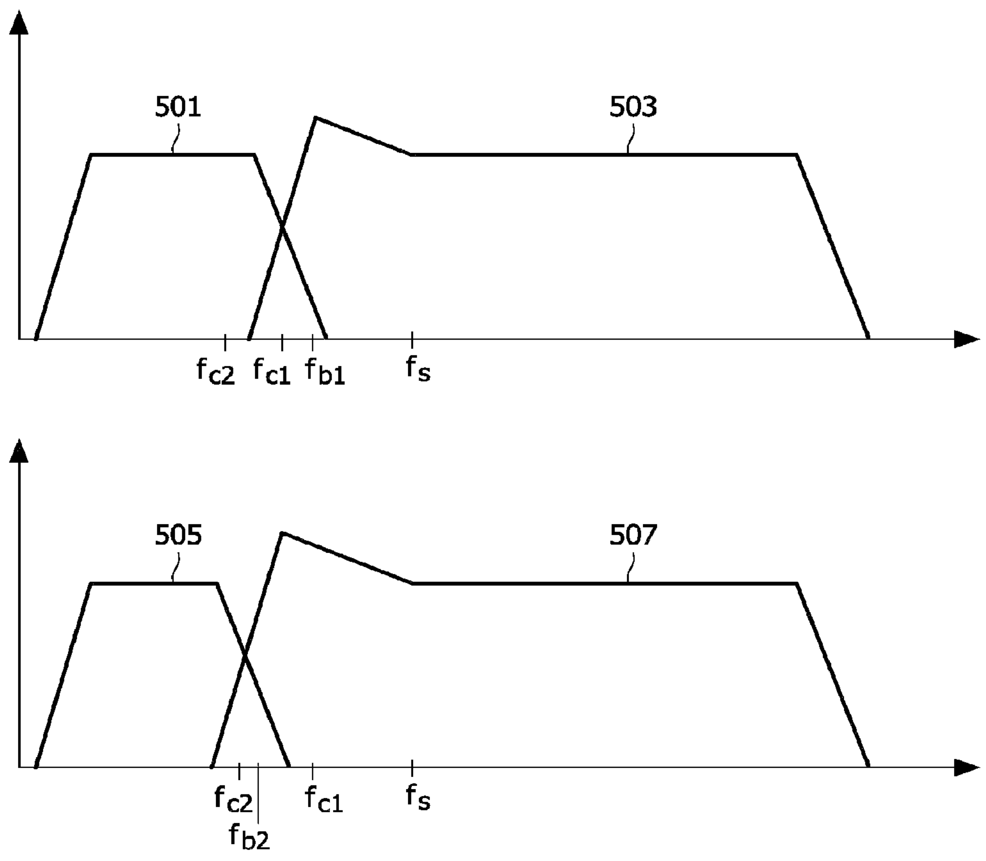
FIG. 5 illustrates an example of frequency responses for elements of an audio system in accordance with some embodiments of the invention.

FIG. 5 illustrates an example of the effective frequency responses of the signal paths for the spatial input channel to the output of the first drive unit 119 and second drive unit 115 respectively for different values of the driver excursion indication.

In particular, FIG. 5 illustrates a subwoofer frequency response 501 and a satellite frequency response 503 for the first spatial signal at a higher than average sound level. In the example, the two frequency responses define a cross-over frequency $f_{c1}$ which may e.g. be around 200 Hz. Thus, frequencies below 200 Hz are predominantly fed to the subwoofer 105 and frequencies above 200 Hz are predominantly fed to the first satellite speaker 101. Furthermore, the first bass boost unit 117 provides a bass boost for lower frequencies of the frequency interval which is supported by the first satellite speaker 101. In particular, the gain for frequencies between $f_{b1}$ and $f_s$ is higher than the average gain for the frequencies above $f_s$. This lower frequency boost compensates for the reduced efficiency of the first satellite speaker 101.

FIG. 5 furthermore illustrates a subwoofer frequency response 505 and a satellite frequency response 507 for the first spatial signal at a lower than average sound level. At this lower sound level the driver excursion indication will indicate a lower diaphragm excursion. This will allow the system to increase the frequency range which is handled by the first satellite speaker 101 and to reduce the frequency range which is handled by the subwoofer 105. Thus, the controller 117 controls the first splitter 107 to reduce the cross-over frequency from $f_{c1}$ to $f_{c2}$. At the same time, it controls the first bass boost unit 117 to increase the level of bass boost provided. This increase is achieved by both reducing the lower frequency of the frequency range in which the bass boost is applied from $f_{b1}$ to $f_{b2}$. In addition, the gain of the bass boost is increased for some frequencies (particularly frequencies between $f_{b1}$ and $f_{b2}$) to reflect the reduced sensitivity of the first satellite speaker 101 at these frequencies. Thus, in response to the detection of the reduced excursion, the controller 117 changes the cross-over and bass frequency extension such that more low frequencies are handled by the first satellite speaker 101. For example, the cross-over frequency may be reduced to 100 Hz.

The operation of the drive system thus automatically and dynamically adjusts how the input signal is proportioned between the subwoofer 105 and the satellite speakers 101, 103. In particular, at low sound levels, an increasing frequency range is supported by satellite speakers 101, 105 thereby providing improved spatial perception. However, at higher sound levels the subwoofer 105 supports an increasing proportion of the frequency range thereby preventing distortion or damage caused by excessive excursions for the satellite speakers 101, 103.

Thus, the system may specifically allow the home cinema sound system (including characteristics of both the speakers 101-105 and the drive system) to be designed such that it can support high sound levels without impairing the operation at lower sound levels by the constraints imposed at high sound levels.

In the example, the low frequency boost was illustrated as a simple linearly increasing gain for lower frequencies. However, it will be appreciated that any suitable low frequency boost may be achieved and that different characteristics may be suitable for different embodiments. Specifically, the low frequency boost may be designed to match the sensitivity frequency response for the satellite speakers and may seek to be complementary to this within a given frequency interval. Thus, the low frequency boost may be arranged to compensate for variations in the frequency response of the satellite speakers.

The low frequency boost provides increased gain for frequencies of the second signal within a first frequency band relative to frequencies above the first frequency band. Thus, in the overall frequency response of the signal path of the first spatial signal for the first satellite speaker 101, there exists a frequency range with an increased gain relative to the gain of the frequency interval that is covered by the satellite speaker and which is above the frequency range.

As a specific example, a passband may be determined for the satellite signal path. This passband may for example be defined as the band within which the gain is higher than X dB below the average gain or e.g. the maximum gain (where X may e.g. be 3 dB or 6 dB). For example, the passband may be determined as the frequencies between the 3 or 6 dB cut-of frequencies.

Within this passband, a low frequency boost is provided. Thus, there exists within the passband a frequency range wherein the gain is increased relative to the gains of frequencies higher than the frequency range. For example, in FIG. 5, the frequency range $f_{b1}$ to $f_s$ (and $f_{b2}$ to $f_s$) have a higher gain than for the frequencies above fs. The increase in gain may in particular be relative to the average gain of the passband at frequencies above the frequency range (e.g. above $f_s$).

In particular, a frequency range may exist for which the gain for all frequencies are at least 3 dB higher than the average gain for frequencies above the frequency range (in the example of FIG. 5 such a frequency range will be smaller than $f_{b1}$ to $f_s$ (or $f_{b2}$ to $f_s$)).

It will be appreciated that the low frequency boost is generally applied in a frequency interval which is close to the cross-over frequency but not directly adjacent to it (in order to provide a suitable frequency range to provide the required drop-off). However, typically the increased gain is applied less than 50 Hz (or in many cases 25 Hz) from the cut-off frequency.

In many cases, the cross-over frequency is adjustable within a given range; i.e. as a function of the driver excursion indication, the cross-over frequency may be adjusted from a lowest possible frequency to a highest possible frequency. For example, in the example of FIG. 5, the highest possibly cross-over frequency may be $f_{c1}$ and the lowest possible frequency may be $f_{c2}$.

As can also be seen, the first bass boost unit 117 may for some cross-over frequencies extend the low frequency boost into the frequency range in which the cross-over frequency may be varied. For example, for the low driver excursion indication, the frequency response 507 includes a substantial gain increase (relative to a gain at higher frequencies) at the cross-over frequency $f_{c1}$ which is used for higher driver excursion indications.

In particular, the frequency responses may be varied such that there exists a frequency band which has a gain that is higher than a nominal gain for at least one value of the cross-over frequency and below the nominal gain for at least one other value of the cross-over frequency. This frequency band may specifically exist within the frequency range in which the cross-over frequency can be varied. The nominal gain may for example be determined as the average gain for frequencies above the frequency band.

Thus, the frequency response includes frequency bands that are varied from providing an amplification at some values of the driver excursion indication to providing an attenuation at other values of the driver excursion indication (e.g. relative to a nominal or average gain). E.g. in the example of FIG. 5, the frequency band around $f_{c1}$ provides an attenuation for the frequency response 503 and an increased gain for the frequency response 507.

The driver excursion indication can be derived from different parameters or settings in different embodiments.

For example, the excursion processor 125 may in some embodiments determine the driver excursion indication in response to a volume setting for the drive system. Thus, the drive system may simply adjust the cross-over frequency and bass frequency extension as a function of the volume setting. Thus, for lower volume settings, the cross-over frequency and the frequency and/or gain of the low frequency boost may be set to one value; and for higher volume settings, the cross-over frequency and the frequency for the low frequency boost may be increased and the gain may reduced.

This approach may provide a low complexity and easy to implement drive system. In particular, the indirect indication of the diaphragm excursion may be used to provide a relatively accurate adaptation.

In some embodiments, the driver excursion indication may be based on a measurement of a signal characteristic of the satellite signal at some point in the signal path for the satellite signal. For example, the signal level following the first bass boost unit 117 may be measured by a suitable amplitude or power detector. The measured value may be fed to the excursion processor 125 which can then proceed to determine the driver excursion indication in response thereto. Specifically, the amplitude measurement may be used directly as the driver excursion indication.

The point at which the signal level is measured may vary in different embodiments. For example, in some embodiments, the signal level may be measured at the input to the final audio power amplifier. In other embodiments, the signal level may be measured at the output of the final audio power amplifier. Thus, the driver excursion indication may be determined to reflect the amplitude of the actual drive signal fed to the satellite speaker.

Such a measurement based driver excursion indication may provide improved performance in many embodiments. In particular, it may provide a more accurate indication of the actual excursion of the diaphragm of the satellite speaker. In particular the measurement at the output of the power amplifier may provide a highly accurate indication as the measurement takes into account the effect of the power amplifier.

Figure 6:
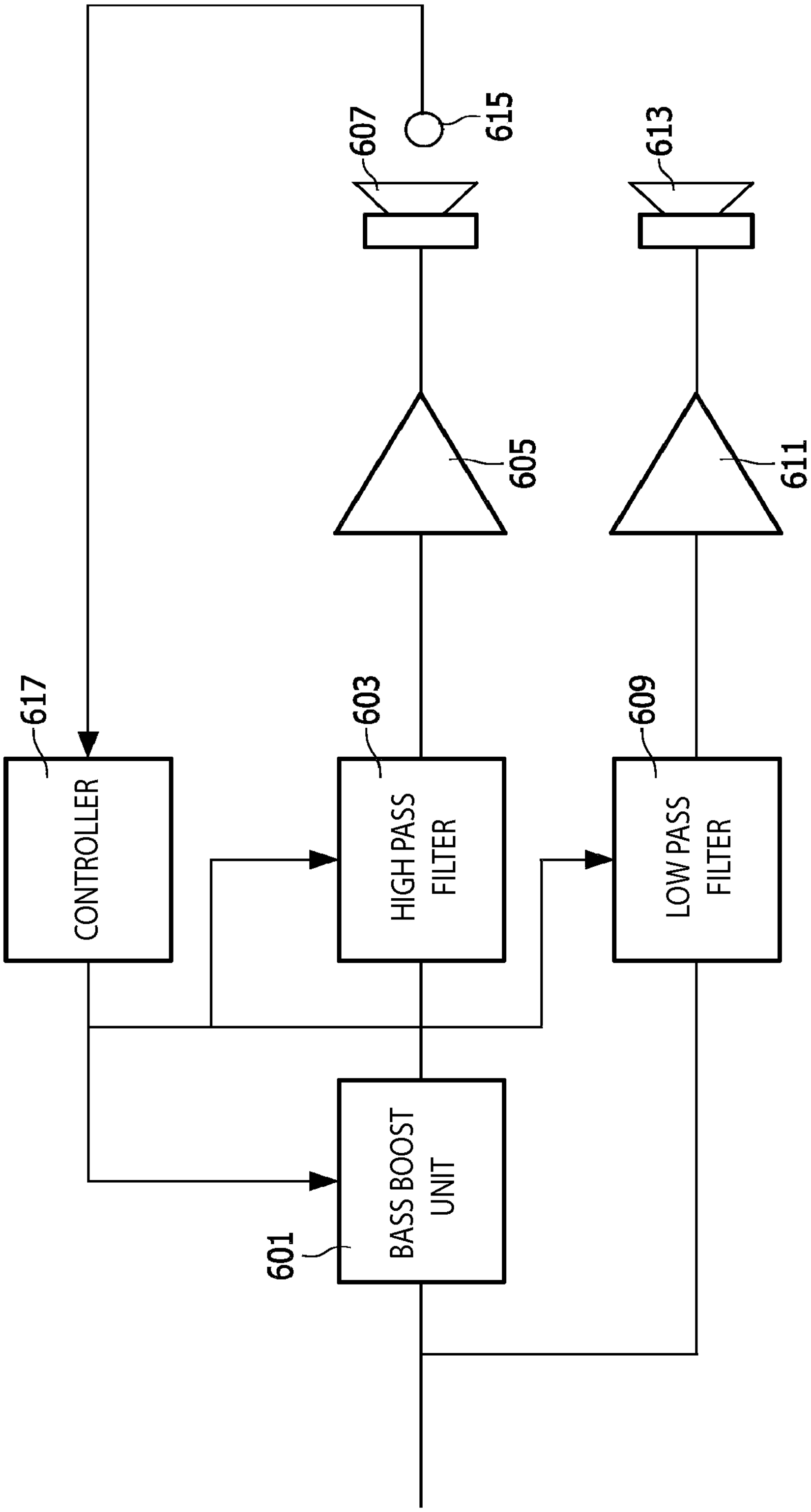
FIG. 6 illustrates an example of an audio system in accordance with some embodiments of the invention.

FIG. 6 illustrates an example which provides an even more accurate driver excursion indication. In the example, a measurement device is proximal to the satellite speaker and measures a signal that is indicative of the driver excursion. The measurement device may in some embodiments be a microphone located close to the diaphragm to measure the radiated sound pressure level. In other embodiments, the measuring device may be an accelerometer located on the diaphragm of the satellite speaker. Such measurement based approaches may provide a highly accurate indication of the excursion of the diaphragm and may therefore result in improved performance of the whole system.

It will also be appreciate that FIG. 1 merely illustrates an example of signal paths for the satellite speakers and subwoofer. For example, it will be appreciated that the order of the different functions need not be as illustrated in FIG. 1. For example, the bass frequency extension may be applied before the splitting of the signals. It will also be appreciated that the specific grouping of functions in different blocks is merely exemplary and that other options are possible. For example, the filtering of the input signal to generate the satellite signal may be implemented in a single filter. Thus, the satellite frequency responses 401, 503, 507 of FIGS. 4 and 5 may be generated by a single filter. Also, it will be appreciated that the functions represented by a single block in FIG. 1 may be implemented in different blocks (and possibly at different parts of the signal paths or in different sequences). For example, the functionality of the first splitter 107 may be implemented as two separate filters anywhere in the satellite or subwoofer signal paths respectively.

Indeed, FIG. 6 illustrates an example wherein the first input signal is first fed to a bass boost unit 601 that provides the low frequency extension for the satellite speaker and which forms the first element of the satellite speaker signal path. The bass boost unit 601 is coupled to a high pass filter 603 which removes the very low frequencies that are to be handled by the subwoofer. The high pass filter 603 is coupled to a satellite power amplifier 605 which amplifies the satellite signal to a signal level suitable for being provided to the satellite speaker 607.

The input signal is in parallel fed to a low pass filter 609 which filters out higher frequencies to leave the low frequencies that are to be handled by the subwoofer. The high pass filter 603 and low pass filter 609 thus provides the functionally of splitting the input signal into a satellite signal covering one frequency interval and a subwoofer signal covering another lower frequency interval. The two filters 603, 609 furthermore provide a cross-over frequency between the two paths. The low pass filter 609 is coupled to a subwoofer power amplifier 611 which amplifies the subwoofer signal to a signal level suitable for being provided to the subwoofer 613.

In addition, the system comprises an accelerometer 615 which is located on the diaphragm of the satellite speaker 607. The accelerometer 615 measures the movement of the diaphragm and feeds the resulting measurement signal to a controller 617. The controller 617 then proceeds to set a characteristic of the bass frequency extension dependent on the accelerometer signal. In addition, it proceeds to modify the filter characteristics of the high pass filter 603 and the low pass filter 609 to modify the cross-over frequency.

For example, the controller 617 may contain a look-up table of suitable settings for a range of different accelerometer signals. The appropriate settings may e.g. have been determined by a calibration process for the system.

It will be appreciated that the above description for clarity has described embodiments of the invention with reference to different functional units and processors. However, it will be apparent that any suitable distribution of functionality between different functional units or processors may be used without detracting from the invention. For example, functionality illustrated to be performed by separate processors or controllers may be performed by the same processor or controllers. Hence, references to specific functional units are only to be seen as references to suitable means for providing the described functionality rather than indicative of a strict logical or physical structure or organization.

The invention can be implemented in any suitable form including hardware, software, firmware or any combination of these. The invention may optionally be implemented at least partly as computer software running on one or more data processors and/or digital signal processors. The elements and components of an embodiment of the invention may be physically, functionally and logically implemented in any suitable way. Indeed the functionality may be implemented in a single unit, in a plurality of units or as part of other functional units. As such, the invention may be implemented in a single unit or may be physically and functionally distributed between different units and processors.

Although the present invention has been described in connection with some embodiments, it is not intended to be limited to the specific form set forth herein. Rather, the scope of the present invention is limited only by the accompanying claims. Additionally, although a feature may appear to be described in connection with particular embodiments, one skilled in the art would recognize that various features of the described embodiments may be combined in accordance with the invention. In the claims, the term comprising does not exclude the presence of other elements or steps.

Furthermore, although individually listed, a plurality of means, elements or method steps may be implemented by e.g. a single unit or processor. Additionally, although individual features may be included in different claims, these may possibly be advantageously combined, and the inclusion in different claims does not imply that a combination of features is not feasible and/or advantageous. Also the inclusion of a feature in one category of claims does not imply a limitation to this category but rather indicates that the feature is equally applicable to other claim categories as appropriate. Furthermore, the order of features in the claims do not imply any specific order in which the features must be worked and in particular the order of individual steps in a method claim does not imply that the steps must be performed in this order. Rather, the steps may be performed in any suitable order. In addition, singular references do not exclude a plurality. Thus references to “a”, “an”, “first”, “second” etc do not preclude a plurality. Also, the terms frequency interval, frequency range and frequency band have been used interchangeably. Reference signs in the claims are provided merely as a clarifying example shall not be construed as limiting the scope of the claims in any way.

The invention claimed is:

1. A drive system for generating drive signals for audio drivers, the drive system comprising:

a splitter (107) for generating a first signal and a second signal from an input signal, wherein the first signal comprises signal components of a first frequency interval of the input signal and the second signal comprises signal components of a second frequency interval of the input signal, the first and second frequency intervals having a cross-over frequency and the first frequency interval corresponding to lower frequencies than the second frequency interval;

a first drive circuit (111, 115) coupled to the splitter (107) and arranged to generate a first drive signal for a first audio driver (105) from the first signal;

a second drive circuit (117, 119) coupled to the splitter (107) and arranged to generate a second drive signal for a second audio driver (101) from the second signal;

means (125) for determining a driver excursion indication for the second audio driver (101);

means (117) for providing a bass frequency extension for the second audio driver (101) by applying low frequency boost to the second signal, wherein the low frequency boost provides increased gain above an original maximum gain value for frequencies of the second signal within a first frequency band of the second frequency interval relative to frequencies of the second frequency band above the first frequency band; and adjustment means (127) for performing a combined adjustment of the cross-over frequency and a characteristic of the low frequency boost in response to the driver excursion indication.

2. The drive system of claim 1 wherein the increased gain is at least 3 dB higher than an average gain for frequencies of the second signal within the second frequency interval and above the first frequency band.

3. The drive system of claim 1 wherein the adjustment means (127) is arranged to adjust the cross-over frequency within a frequency range and to provide increased gain for at least some frequencies above a current value of the cross-over frequency but within the frequency range.

4. The drive system of claim 1 wherein the adjustment means (127) is arranged to modify a frequency characteristic of the low frequency boost in response to the driver excursion indication.

5. The drive system of claim 4 wherein the adjustment means (127) is arranged to bias the cross-over frequency and a lower frequency for the low frequency boost towards lower frequencies for a reduced driver excursion.

6. The drive system of claim 1 wherein the adjustment means (127) is arranged to vary a frequency response for the second drive signal such that a gain in at least a first frequency band is higher than an average gain of the frequency response above the first frequency band and within the second frequency interval for at least one value of the cross-over frequency, and below the average gain for at least a second value of the cross-over frequency.

7. The drive system of claim 1 wherein the boost means (117) is arranged to provide the low frequency boost to compensate a sensitivity reduction for the second audio driver.

8. The drive system of claim 1 further comprising means (125) for determining the driver excursion indication in response to a volume setting for the drive system.

9. The drive system of claim 1 further comprising: means for measuring a signal level for the second signal at a point of the signal path for the second signal provided by the second drive circuit; and means for determining the driver excursion indication in response to the signal level.

10. The drive system of claim 1 further comprising: means for receiving a measurement signal from a driver excursion measuring device proximal to the second audio driver (101); and means for determining the driver excursion indication in response to the measurement signal.

11. The drive system of claim 1 further comprising: a further splitter (109) for generating a third signal and a fourth signal from a further input signal, wherein the third signal comprises signal components of the first frequency interval of the further input signal and the fourth signal comprises signal components of the second frequency interval of the further input signal; a third drive circuit (121, 123) coupled to the further splitter (109) and arranged to generate a third drive signal for a third audio driver (103) from the fourth signal; and wherein the first drive circuit (111, 115) is arranged to generate the first drive signal from a combination of the first signal and the third signal.

12. A surround sound speaker system comprising:

a driver system as claimed in claim 1;

the first audio driver (105) being a subwoofer; and a plurality of speakers including the second audio driver (101).

13. A method of operation for a drive system, the method comprising:

generating a first signal and a second signal from an input signal, wherein the first signal comprises signal components of a first frequency interval of the input signal and the second signal comprises signal components of a second frequency interval of the input signal, the first and second frequency intervals having a cross-over frequency and the first frequency interval corresponding to lower frequencies than the second frequency interval;

generating a first drive signal for a first audio driver (105) from the first signal;

generating a second drive signal for a second audio driver (101) from the second signal;

determining a driver excursion indication for the second audio driver (101);

providing a bass frequency extension for the second audio driver (101) by applying low frequency boost to the second signal wherein the low frequency boost provides increased gain above an original maximum gain value for frequencies of the second signal within a first frequency band of the second frequency interval relative to frequencies of the second frequency band above the first frequency band; and performing a combined adjustment of the cross-over frequency and a characteristic of the low frequency boost in response to the driver excursion indication.

14. The drive system of claim 1, wherein the adjustment means (127) further performs a modification of a gain characteristic of the low frequency bass boost in response to the driver excursion indication.

* * * * *